(12) United States Patent
Mehrotra et al.

(10) Patent No.: US 7,510,923 B2
(45) Date of Patent: Mar. 31, 2009

(54) SLIM SPACER IMPLEMENTATION TO IMPROVE DRIVE CURRENT

(75) Inventors: Manoj Mehrotra, Plano, TX (US); Karen Hildegard Ralston Kirmse, Richardson, TX (US); Shirin Siddiqui, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 276 days.

(21) Appl. No.: 11/641,578

(22) Filed: Dec. 19, 2006

(65) Prior Publication Data

US 2008/0145991 A1 Jun. 19, 2008

(51) Int. Cl.
*H01L 21/338* (2006.01)

(52) U.S. Cl. .................. 438/184; 438/230; 438/265; 438/266; 438/303; 257/900; 257/E21.626; 257/E21.64

(58) Field of Classification Search .............. 438/184, 438/230, 265, 266, 303; 257/900, E21.626, 257/E21.64

See application file for complete search history.

(56) References Cited

U.S. PATENT DOCUMENTS

| | | | |
|---|---|---|---|
| 5,444,282 A | 8/1995 | Yamaguchi et al. | |
| 6,093,594 A | 7/2000 | Yeap et al. | |
| 6,346,468 B1 * | 2/2002 | Pradeep et al. | 438/595 |
| 6,579,770 B2 | 6/2003 | Rodder et al. | |
| 6,664,156 B1 * | 12/2003 | Ang et al. | 438/229 |
| 6,713,360 B2 | 3/2004 | Jain et al. | |
| 6,754,912 B1 * | 6/2004 | Hayashi et al. | 4/420.2 |
| 6,790,733 B1 | 9/2004 | Natzle et al. | |
| 7,064,396 B2 | 6/2006 | Chen et al. | |
| 7,091,128 B2 | 8/2006 | Ajmera et al. | |
| 7,125,808 B2 | 10/2006 | Clementi et al. | |
| 2001/0036713 A1 | 11/2001 | Rodder et al. | |
| 2002/0068403 A1 * | 6/2002 | Huang | 438/261 |
| 2006/0011988 A1 | 1/2006 | Chen et al. | |
| 2006/0014351 A1 * | 1/2006 | Lo et al. | 438/305 |
| 2006/0019456 A1 | 1/2006 | Bu et al. | |
| 2006/0057797 A1 | 3/2006 | Ajmera et al. | |

* cited by examiner

*Primary Examiner*—Thanh V Pham
(74) *Attorney, Agent, or Firm*—Frederick J. Telecky, Jr.; Wade J. Brady, III

(57) ABSTRACT

Slim spacers are implemented in transistor fabrication. More particularly, wide sidewall spacers are initially formed and used to guide dopants into source/drain regions in a semiconductor substrate. The wide sidewall spacers are then removed and slim sidewall spacers are formed alongside a gate stack of the transistor. The slim spacers facilitate transferring stress from an overlying pre metal dielectric (PMD) liner to a channel of the transistor, and also facilitate reducing a resistance in the transistor by allowing silicide regions to be formed closer to the channel. This mitigates yield loss by facilitating predictable or otherwise desirable behavior of the transistor.

17 Claims, 9 Drawing Sheets

SLIM SPACER IMPLEMENTATION TO IMPROVE DRIVE CURRENT

FIELD

The present invention relates generally to semiconductor processing, and more particularly to implementing slim spacers in transistor fabrication.

BACKGROUND

Several trends presently exist in the semiconductor and electronics industry. Devices are continually being made smaller, faster and requiring less power. One reason for these trends is that more personal devices are being fabricated that are relatively small and portable, thereby relying on a battery as their primary supply. For example, cellular phones, personal computing devices, and personal sound systems are devices that are in great demand in the consumer market. In addition to being smaller and more portable, personal devices are also requiring increased memory and more computational power and speed. In light of these trends, there is an ever increasing demand in the industry for smaller and faster transistors used to provide the core functionality of the integrated circuits used in these devices.

Accordingly, in the semiconductor industry there is a continuing trend toward manufacturing integrated circuits (ICs) with higher densities. To achieve high densities, there has been and continues to be efforts toward scaling down dimensions (e.g., at submicron levels) on semiconductor wafers, that are generally produced from bulk silicon. In order to accomplish such high densities, smaller feature sizes, smaller separations between features, and more precise feature shapes are required in integrated circuits (ICs) fabricated on small rectangular portions of the wafer, commonly known as die. This may include the width and spacing of interconnecting lines, spacing and diameter of contact holes, as well as the surface geometry of various other features (e.g., corners and edges).

It can be appreciated that significant resources go into scaling down device dimensions and increasing packing densities. For example, significant man hours may be required to design such scaled down devices, equipment necessary to produce such devices may be expensive and/or processes related to producing such devices may have to be very tightly controlled and/or be operated under very specific conditions, etc. Accordingly, it can be appreciated that there can be significant costs associated with exercising quality control over semiconductor fabrication, including, among other things, costs associated with discarding defective units, and thus wasting raw materials and/or man hours, as well as other resources, for example. Additionally, since the units are more tightly packed on the wafer, more units are lost when some or all of a wafer is defective and thus has to be discarded. Accordingly, techniques that mitigate yield loss (e.g., a reduction in the number of acceptable or usable units), among other things, would be desirable.

SUMMARY

The following presents a summary to provide a basic understanding of one or more aspects of the disclosure herein. This summary is not an extensive overview. It is intended neither to identify key or critical elements nor to delineate scope of the disclosure herein. Rather, its primary purpose is merely to present one or more aspects in a simplified form as a prelude to a more detailed description that is presented later.

Slim spacers are implemented in transistor fabrication. More particularly, wide sidewall spacers are initially formed and used to guide dopants into source/drain regions in a semiconductor substrate. The wide sidewall spacers are then removed and slim sidewall spacers are formed alongside a gate stack of the transistor. The slim spacers facilitate transferring stress from an overlying pre metal dielectric (PMD) liner to a channel of the transistor, and also facilitate reducing a resistance in the transistor by allowing silicide regions to be formed closer to the channel. This mitigates yield loss by facilitating predictable or otherwise desirable behavior of the transistor.

To the accomplishment of the foregoing and related ends, the following description and annexed drawings set forth certain illustrative aspects. Other aspects, advantages and/or features may, however, become apparent from the following detailed description when considered in conjunction with the annexed drawings.

DETAILED DESCRIPTION

Figure 1:
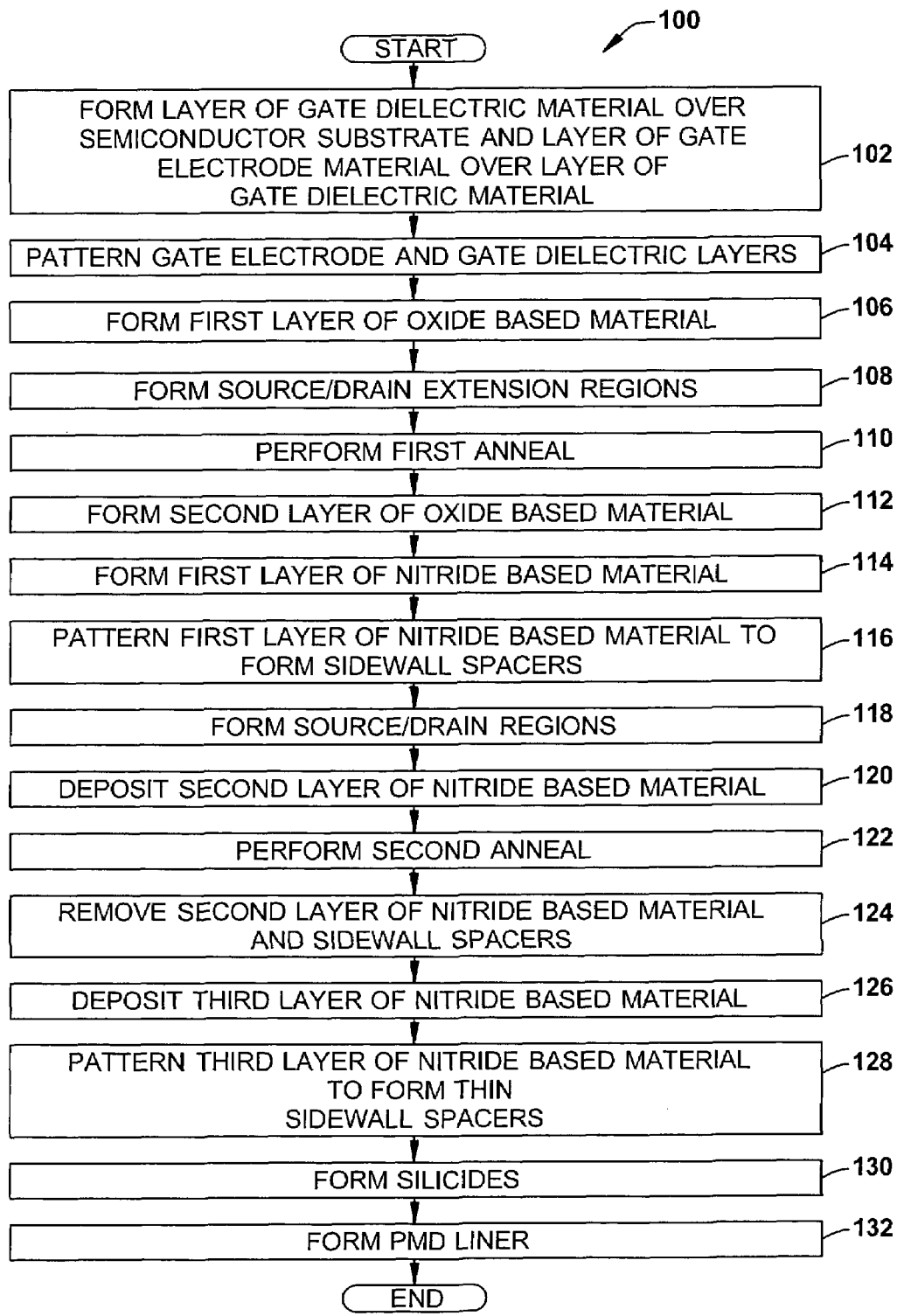
FIG. 1 is a flow diagram illustrating an example methodology for implementing slim sidewall spacers in transistor fabrication.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

An example methodology 100 for implementing slim sidewall spacers in transistor fabrication is illustrated in FIG. 1, and an example semiconductor substrate 200 whereon such a methodology is implemented is illustrated in cross-sectional view in FIGS. 2-17. While the method 100 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Figure 2:
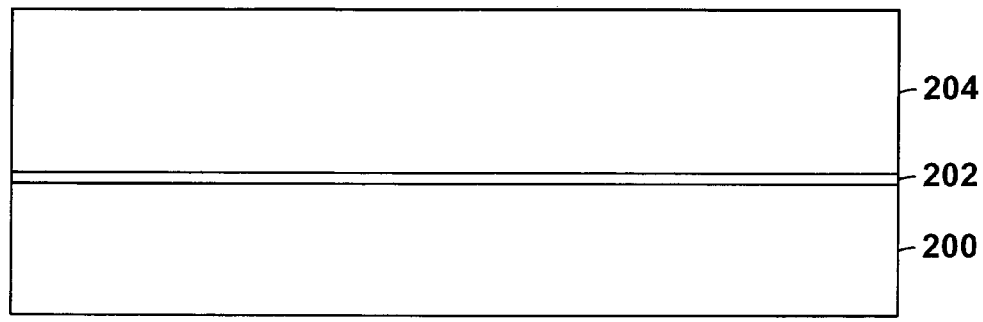
FIGS. 2-17 are cross-sectional views of an example semiconductor substrate whereon an example transistor having slim sidewall spacers is formed.

At 102, a layer of gate dielectric material 202 is formed over the semiconductor substrate 200 and a layer of gate electrode material 204 is formed over the layer of gate dielectric material 202 (FIG. 2). The layer of gate dielectric material 202 generally comprises an oxide (or other dielectric) based material and/or a high-k material, for example, and is relatively thin, being formed to a thickness of between about 1 nm and about 20 nm, for example. The layer of gate electrode material 204 generally comprises a polysilicon (or other semiconductor) based material, and is formed to a thickness of between about 20 nm and about 100 nm, for example.

Figure 3:
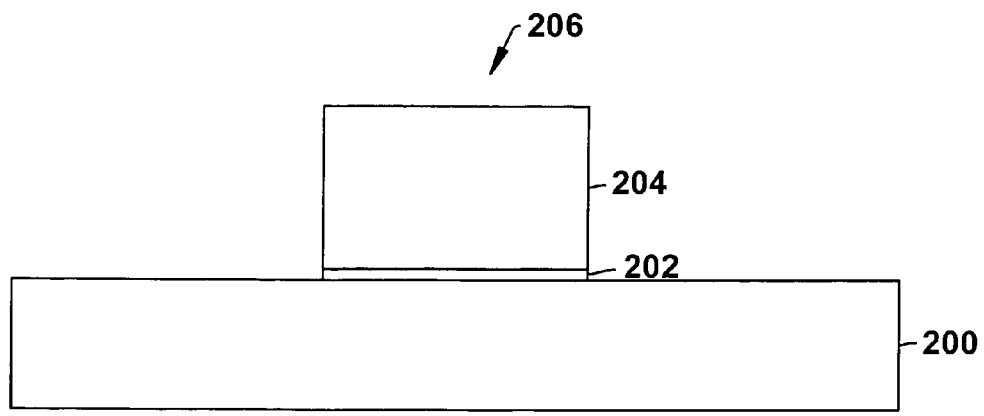

The layer of gate electrode material 204 and the layer of gate dielectric material 202 are then patterned at 104 to establish a gate structure or stack 206 (FIG. 3). It will be appreciated that this, as well as other patterning described herein, can be performed with lithographic techniques, where lithography refers to processes for transferring one or more patterns between various media. In lithography, a light sensitive resist coating is formed over one or more layers to which a pattern is to be transferred. The resist coating is then patterned by exposing it to one or more types of radiation or light which (selectively) passes through an intervening lithography mask containing the pattern. The light causes exposed or unexposed portions of the resist coating to become more or less soluble, depending on the type of resist used. A developer is then used to remove the more soluble areas leaving the patterned resist. The patterned resist can then serve as a mask for the underlying layer or layers which can be selectively treated (e.g., etched).

Figure 4:
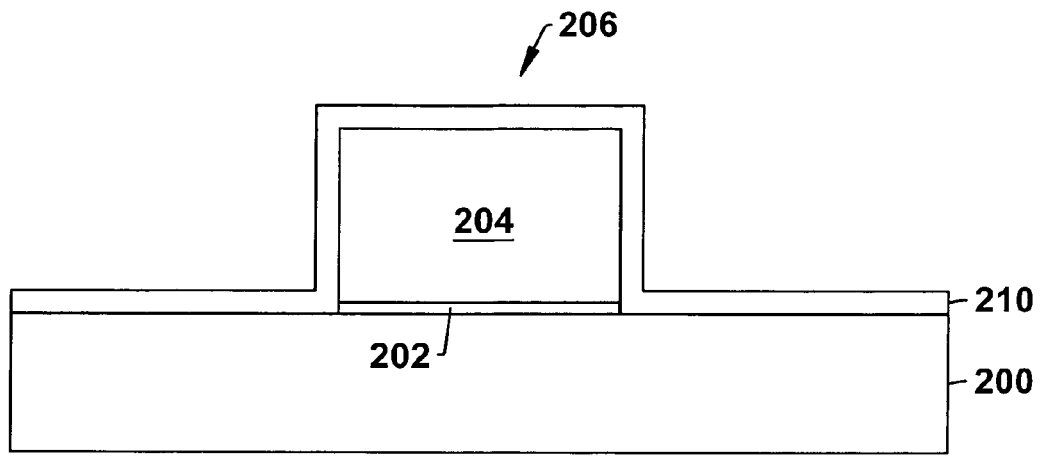

A relatively thin first layer of oxide (or other dielectric) based material 210 is then formed (e.g., grown) over the gate stack 206 and exposed portions of the substrate 200 at 106 (FIG. 4). By way of example, a thermal growth process may be employed to form the first layer of oxide based material 210. Since the layer of gate electrode material 204 may comprise polysilicon, and the first layer of oxide based material 210 is grown therefrom (as well as from the substrate 200), the first layer of oxide based material 210 may be referred to as a layer of poly-ox based material, for example.

Figure 5:
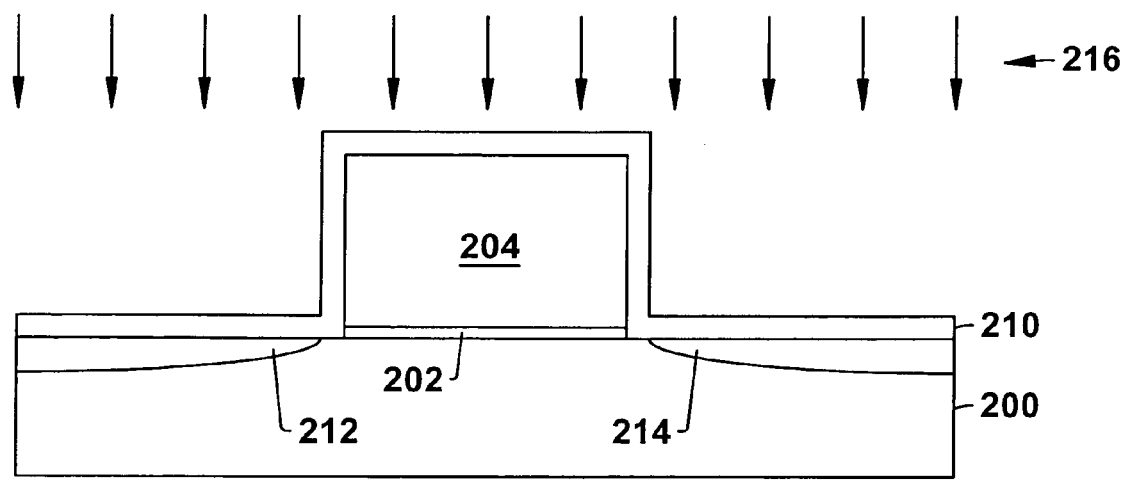
Figure 6:
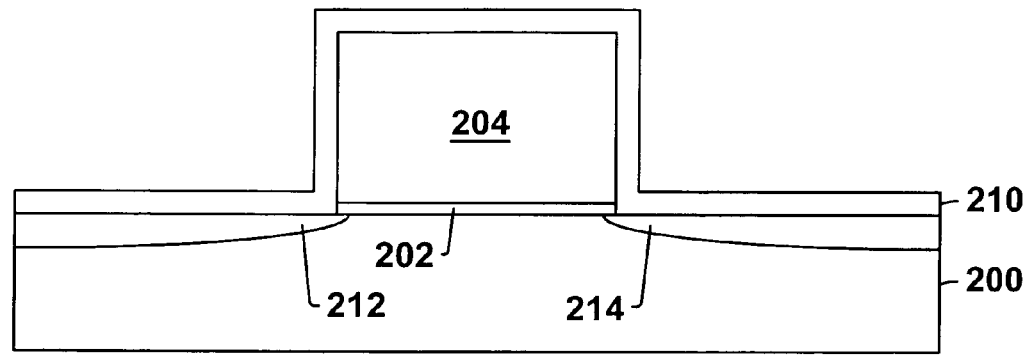

At 108, source 212 and drain 214 extension regions are formed in the substrate 200 by a first implantation 216 whereby dopants are implanted into the substrate 200, where the dopants are substantially blocked by the gate stack 206 (FIG. 5). Depending upon the type of transistor being formed (e.g., PMOS or NMOS), p type dopant atoms (e.g., Boron (B)) or n type dopant atoms (e.g., Phosphorous (P), Arsenic (As) and/or Antimony (Sb)) can be implanted at 108. It can be appreciated that some of the dopants may also be implanted into the top of the gate electrode 204 during the implantation at 108 (e.g., depending upon the thickness of the first 210 layer of oxide based material 210 overlying the gate electrode 204—which can be selectively etched a desired degree in a prior action). Similarly, the dopant atoms establishing the source 212 and drain 214 extension regions may or may not be implanted through the first 210 layer of oxide based material (or remaining degrees thereof). For example, a desired amount of areas of the first 210 layer of oxide based material overlying areas of the substrate 200 where the source 212 and drain 214 extension regions are to be formed may be removed (e.g., etched) before the implantation 216 is performed at 108. At 110, an optional first anneal is performed whereby the dopant atoms of the source 212 and drain 214 extension regions are "activated" and driven under the gate stack 206 slightly (FIG. 6).

Figure 7:
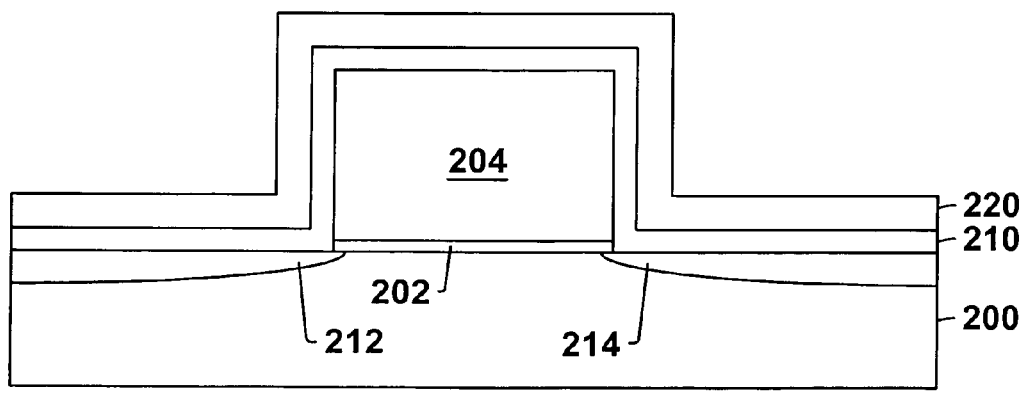
Figure 8:
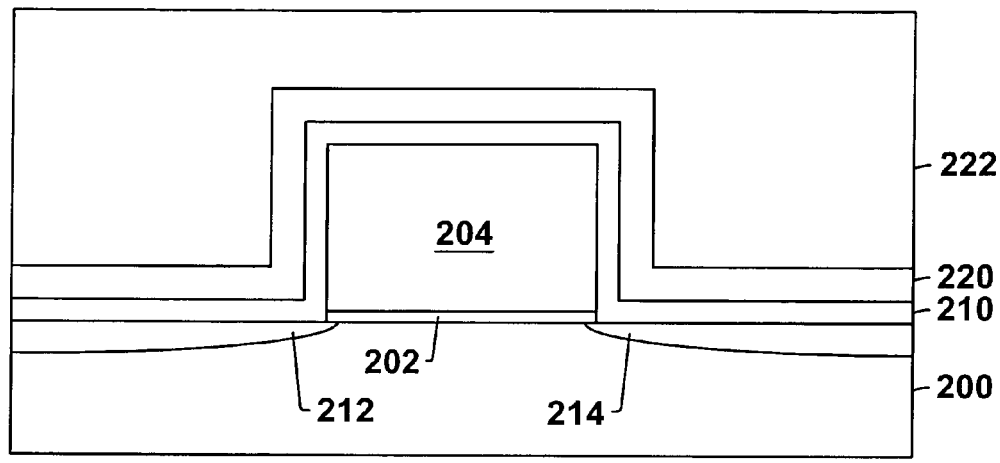
Figure 9:
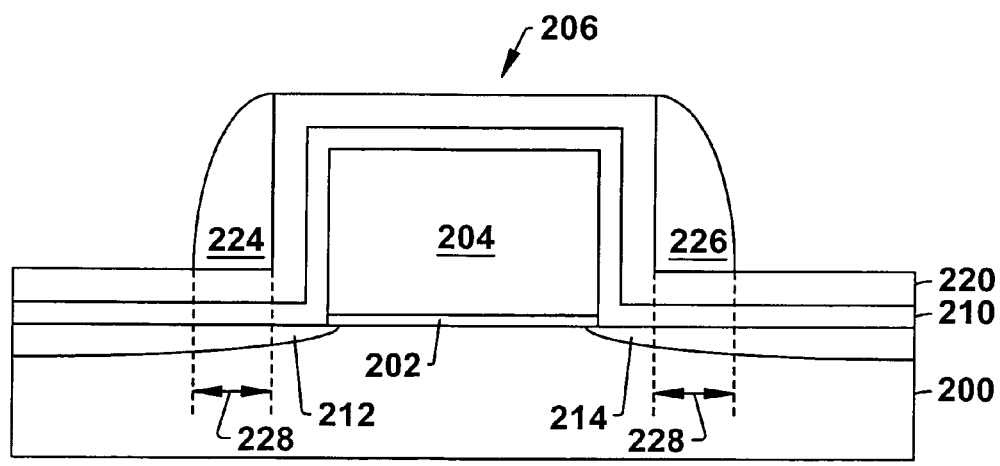

At 112, a second layer of oxide (or other dielectric) based material 220 is formed (e.g., deposited) (FIG. 7). A first layer of nitride based material 222 is then formed (e.g., deposited) at 114 (FIG. 8). The first layer of nitride based material 222 may comprise a silicon rich nitride material, for example, that is effective to apply stress to the transistor. The first layer of nitride based material 222 is patterned at 116 to form first sidewall spacers 224, 226 on either side of the gate stack 206 (FIG. 9). As will be appreciated, these first sidewall spacers 224, 226 have a first width 228 that is larger than a width of subsequently formed sidewall spacers.

Figure 10:
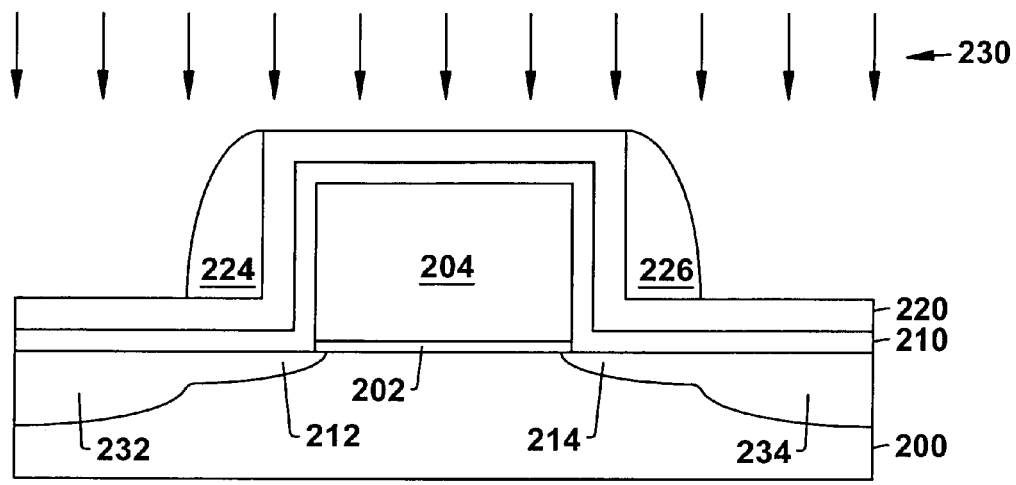

A second implantation 230 is performed at 118 for form source 232 and drain 234 regions in the substrate 200, where dopant atoms are again substantially blocked by the gate stack 206 and the first sidewall spacers 224, 226 (FIG. 10). As with the extension regions 212, 214, p (e.g., Boron (B)) or n (e.g., Phosphorous (P), Arsenic (As) and/or Antimony (Sb)) type dopant atoms can be implanted at 118, depending on the type of transistor being formed (e.g., PMOS or NMOS). Some of the dopants may also be implanted into the top of the gate electrode 204 during the implantation at 118 (e.g., depending upon the thickness of the first 210 and second 220 layers of oxide based material overlying the gate electrode 204— which can be selectively etched a desired degree in a prior action).

Similarly, the dopant atoms establishing the source 232 and drain 234 regions may or may not be implanted through the first 210 and/or second 220 layers of oxide based material (or remaining degrees thereof). For example, a desired amount of areas of the first 210 and/or second 220 layers of oxide based material overlying areas of the substrate 200 where the source 232 and drain 234 regions are to be formed may be removed (e.g., etched) before the implantation 230 is performed at 118. It will be appreciated that the second implant 118 is generally performed at a higher energy than the first implant 108. Accordingly, the source 232 and drain 234 regions are formed somewhat deeper in the substrate 200 than the source 212 and drain 214 extension regions.

Figure 11:
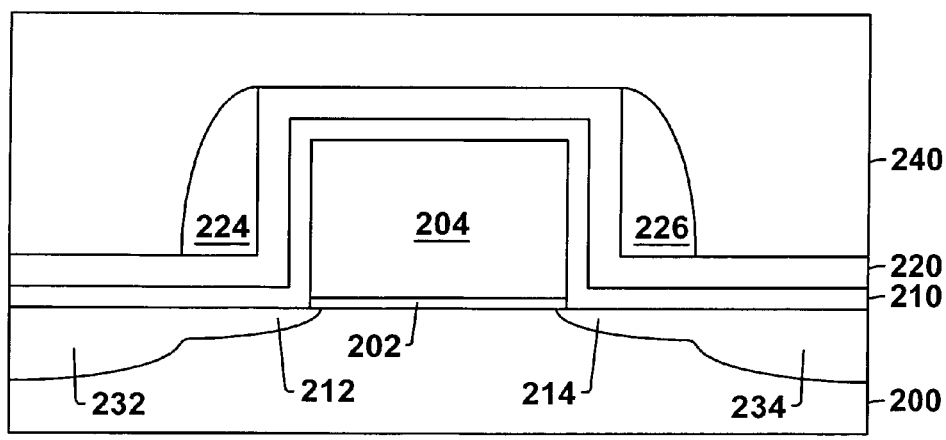
Figure 12:
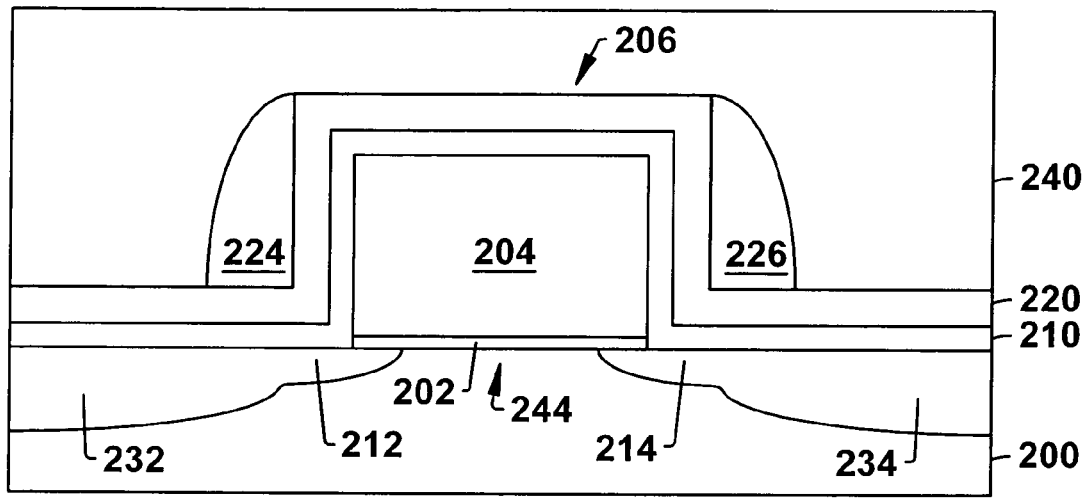

A second layer of nitride based material 240 is then formed (e.g., deposited) at 120 (FIG. 11). An optional second anneal is performed at 122 to "activate" the dopant atoms of the source 232 and drain 234 regions and drive them slightly under the gate stack 206 (FIG. 12). It will be appreciated that the second anneal 122 is generally performed at a higher temperature than the first anneal 110. Accordingly, even though the source 212 and drain 214 extension regions may have already been "activated" by the first anneal at 110, the source 212 and drain 214 extension regions are further "activated" and driven under the gate stack 206 by the second anneal at 122. It will be appreciated that a channel region 244 is defined in the substrate 200 under the gate stack 206 and between the source 212 and drain 214 extension regions (FIG. 12). The transistor "operates", at least in part, by conducting a current in the channel region 244 between the source 212 and drain 214 extension regions when certain voltages are applied to the gate electrode 204 and source 232 and drain 234 regions. Additionally, similar to other acts discussed herein, it will be appreciated that the nitride formed at 120 and the anneal performed at 122 need not be carried out in illustrated order. For example, the anneal at 122 may be performed before the formation at 120.

Figure 13:
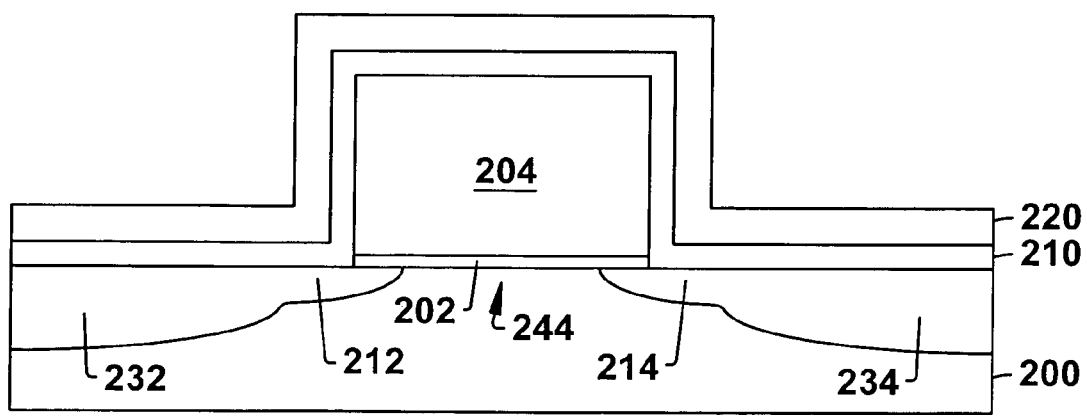

The second layer of nitride based material 240 is removed (e.g., stripped) at 124 (FIG. 13). It will be appreciated that the second layer of nitride based material 240 comprises the same or a substantially similar material as the first layer of nitride based material 222, and thus so do the first sidewall spacers 224, 226. Accordingly, the first sidewall spacers 224, 226 are also removed when the second layer of nitride based material 240 is removed at 124 (FIG. 13). The second layer of nitride based material 240 (and the first sidewall spacers 224, 226) may be stripped with a (hot) phosphoric acid, for example. Such an acid may be selective to oxide, so that little to none of the second layer of oxide based material 220 is removed at 124.

Figure 14:
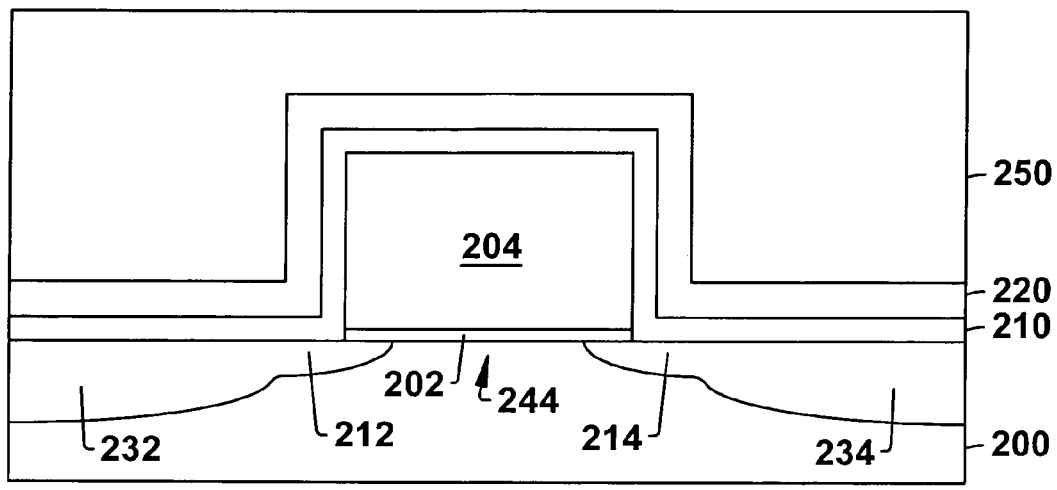
Figure 15:
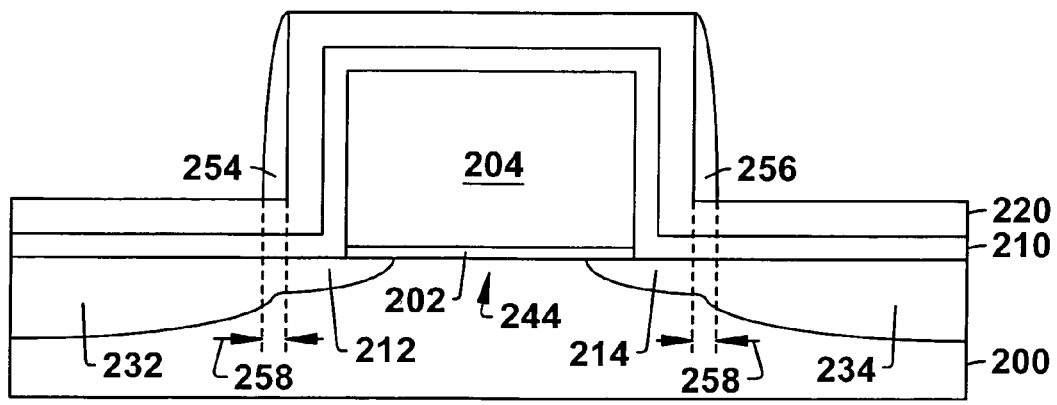
Figure 16:
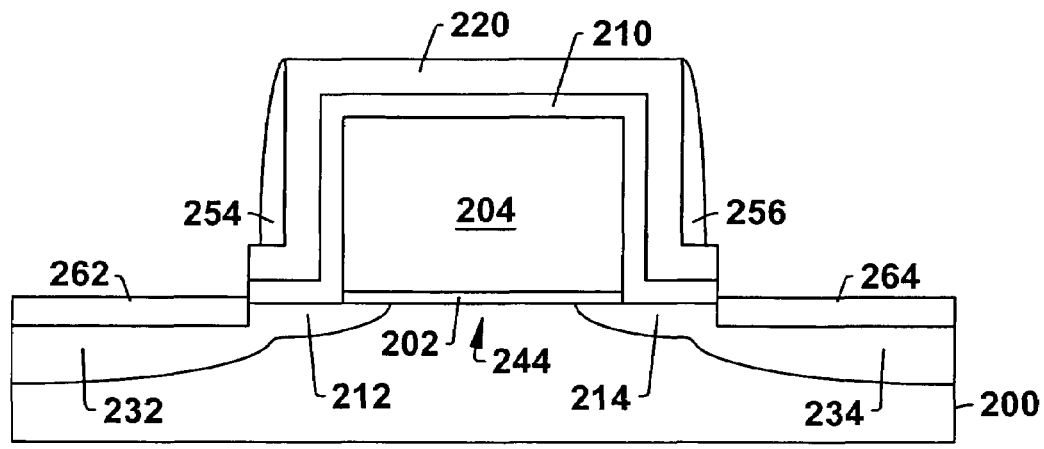

At 126, a third layer of nitride based material 250 is formed (e.g., deposited) (FIG. 14). By way of example, the third layer of nitride based material 250 may comprise bis-tertiarybuty-lamino silane (BTBAS) and/or NH3. The third layer of nitride based material 250 is patterned at 128 to form relatively slim second sidewall spacers 254, 256 on either side of the gate stack 206 (FIG. 15). The second sidewall spacers 254, 256 have a second width 258 that is smaller than the first width 228 of the first sidewall spacers 224, 226 (FIG. 9). The second width 258 of the second sidewall spacers 254, 256 may be between about 10 nm and about 30 nm, for example, whereas the first width 228 of the first sidewall spacers 224, 226 may be between about 50 nm and about 80 nm, for example.

Silicide regions 262, 264 are formed in the substrate 200 above the source 232 and drain 234 regions at 130 (FIG. 16) (e.g., by exposing and treating areas of the substrate above the source 232 and drain 234 regions). The silicide regions 262, 264 are electrically conductive and may comprise a metal, for example. The silicide regions 262, 264 allow an external (voltage) bias to be applied to the source 232 and drain 234 regions of the transistor. Although not illustrated, a silicide region may also be formed in the gate electrode 204 to similarly allow an external bias to be applied thereto.

Figure 17:
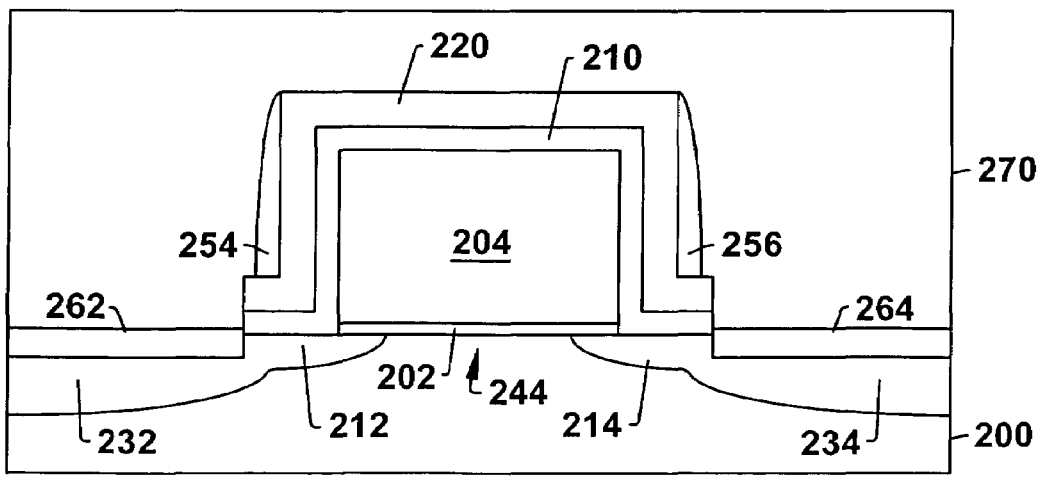

At 132, a pre metal dielectric (PMD) liner 270 is formed (FIG. 17). The PMD liner 270 may comprise a nitride based material, for example. The PMD liner 270 is generally formed in a manner so that it is highly stressed (e.g., relative to surrounding layers/materials). The degree that this stress is transferred to the channel region 244 is a function of the geometry of the transistor. The slim sidewall spacers 254, 256 facilitate transferring more stress to the channel, which improves carrier mobility. Carrier mobility is a measure of the number of carriers (e.g., electrons) per unit area (e.g., of the channel region 244), per unit time, given an applied bias or voltage. An increased carrier mobility means that more carriers can move through the channel region 244 given the same applied bias—which is desired.

In addition to improving drive current, the slim sidewall spacers 254, 256 also facilitate a reduction in the resistance between an external electrical lead (not shown—that contacts one of the silicide regions 262, 264) and the channel region 244. The slim sidewall spacers 254, 256 reduce this resistance by bringing the silicide regions 262, 264 closer to the channel region 244. This reduces the resistance by making the conductive pathway (that carriers have to traverse) from the external electrical lead (not shown) to a silicide region 264, to an extension region 214 to the channel region 244 shorter. This shorter distance results in a lower resistance—which is also desired.

It will be appreciated that, as an alternative, the second 220 and optionally the first 210 also layers of oxide based material can be removed after the second layer of nitride base material 240 and the first sidewall spacers 224, 226 are removed at 124. A third layer of oxide (or other dielectric) based material can then be formed followed by the third layer of nitride based material 250. The third layer of nitride based material 250 can then be etched to form the slim sidewall spacers 254, 256. Where this third layer of oxide based material is thinner than the (combined) thickness of the first 210 and second 220 layers of oxide based material (e.g., formed to a thickness of between about 5 nm and about 25 nm), the silicide regions 262, 264 may be brought even closer to the channel region 244 desirably further reducing resistance.

Alternatively, at least some of the second 220 and possibly the first 210 also layers of oxide based materials can be removed to similarly bring the silicide regions 262, 264 closer to the channel region 244. The thickness of one or both of these layers 220, 210 may be reduced, for example, when the second layer of nitride base material 240 and the first sidewall spacers 224, 226 are removed at 124 (e.g., by adapting an etch chemistry to remove oxide). The third layer of nitride based material 250 can then be formed over the thinned remaining second 220 and/or first 210 layers of oxide based material, and etched to form the slim sidewall spacers 254, 256.

It will be appreciated that forming the slim sidewall spacers 254, 256 from the third layer of nitride based material 250 is desirable because the resulting spacers 254, 256 are substantially uniform. In contrast, non-uniformities may result if an attempt is made to merely reduce the first sidewall spacers 224, 226 (e.g., in thickness). For example, the first sidewall spacers 254, 256 may not match if an attempt is made to etch some of them away. As a result, the left sidewall spacer 224 may be thicker/thinner and/or shorter/taller than the right sidewall spacer 226, etc. This is undesirable since such asymmetries may be propagated into other elements of the transistor (e.g., the implanted source 232 and drain 234 regions, the later formed silicide 262, 264 regions, etc.), which may cause the transistor to behave in an unpredictable or otherwise undesirable manner, necessitating more discards. As such, forming slim sidewall spacers as described herein allows resulting transistors to perform in a more predictable or otherwise desirable manner, thus mitigating yield loss.

It will be appreciated that, substrate and/or semiconductor substrate as used herein may comprise any type of semiconductor body (e.g., silicon, SiGe, SOI) such as a semiconductor wafer and/or one or more die on a wafer, as well as any other type of semiconductor and/or epitaxial layers associated therewith. Also, while reference is made throughout this document to exemplary structures in discussing aspects of methodologies described herein (e.g., those structures presented in FIGS. 2-17 while discussing the methodology set forth in FIG. 1), that those methodologies are not to be limited by the corresponding structures presented. Rather, the methodologies (and structures) are to be considered independent of one another and able to stand alone and be practiced without regard to any of the particular aspects depicted in the Figs. Additionally, layers described herein, can be formed in any suitable manner, such as with spin on, sputtering, growth and/or deposition techniques, etc.

Also, equivalent alterations and/or modifications may occur to those skilled in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein

What is claimed is:

1. A method for implementing slim sidewall spacers in transistor fabrication on a semiconductor substrate, comprising:
    forming a first layer of oxide based material over a gate stack on the substrate and over exposed areas of a substrate on either side of the gate stack;
    forming source/drain extension regions in the substrate on either side of the gate stack;
    performing a first anneal;
    forming a second layer of oxide based material over the first layer of oxide based material;

forming a first layer of nitride based material over the second layer of oxide based material;

patterning the first layer of nitride based material to establish first sidewall spacers on either side of the gate stack;

forming source/drain regions in the substrate on either side of the gate stack and first sidewall spacers;

forming a second layer of nitride based material over the first sidewall spacers and exposed areas of the second layer of oxide based material;

performing a second anneal;

removing the second layer of nitride based material and the first sidewall spacers;

forming a third layer of nitride based material over the second layer of oxide based material; and patterning the third layer of nitride based material to establish second sidewall spacers on either side of the gate stack, the second sidewall spacers having a second width that is smaller than a first width of the first sidewall spacers.

2. The method of claim 1, the second width between about 10 nm and about 30 nm.

3. The method of claim 2, the first width between about 50 nm and about 80 nm.

4. The method of claim 1, comprising:

forming silicide regions in the substrate above the source/drain regions.

5. The method of claim 1, comprising:

forming a pre metal dielectric (PMD) liner, where the second sidewall spacers facilitate transferring stress from the PMD liner to a channel region in the substrate below the gate stack and between the source/drain extension regions.

6. The method of claim 1, comprising:

removing at least some of the second layer of oxide based material to thin the same before forming the first layer of nitride based material.

7. The method of claim 6, comprising:

removing at least some of the first layer of oxide based material to thin the same before forming the first layer of nitride based material.

8. The method of claim 1, comprising:

removing the second and first layers of oxide based material, and forming a third layer of oxide based material before forming the third layer of nitride based material, the third layer of oxide based material formed to a thickness that is less than a cumulative thickness of the second and first layers of oxide based material.

9. The method of claim 1, the second anneal performed at a higher temperature than the first anneal.

10. A method for implementing slim sidewall spacers in transistor fabrication on a semiconductor substrate, comprising:

forming a first layer of oxide based material over a gate stack on the substrate and over exposed areas of a substrate on either side of the gate stack;

forming a first layer of nitride based material over the first layer of oxide based material;

patterning the first layer of nitride based material to establish first sidewall spacers on either side of the gate stack;

forming source/drain regions in the substrate on either side of the gate stack and first sidewall spacers;

forming a second layer of nitride based material over the first sidewall spacers and exposed areas of the first layer of oxide based material;

removing the second layer of nitride based material and the first sidewall spacers;

forming a third layer of nitride based material over the first layer of oxide based material; and patterning the third layer of nitride based material to establish second sidewall spacers on either side of the gate stack, the second sidewall spacers having a second width that is smaller than a first width of the first sidewall spacers.

11. The method of claim 10, the second width between about 10 nm and about 30 nm.

12. The method of claim 11, the first width between about 50 nm and about 80 nm.

13. The method of claim 10, comprising:

forming a pre metal dielectric (PMD) liner, where the second sidewall spacers facilitate transferring stress from the PMD liner to a channel region in the substrate below the gate stack and between the source/drain regions.

14. The method of claim 10, comprising:

removing the first layer of oxide based material, and forming a second layer of oxide based material before forming the third layer of nitride based material, the second layer of oxide based material formed to a thickness that is less than a thickness of the first layer of oxide based material.

15. The method of claim 11, comprising:

removing the first layer of oxide based material, and forming a second layer of oxide based material before forming the third layer of nitride based material, the second layer of oxide based material formed to a thickness that is less than a thickness of the first layer of oxide based material.

16. The method of claim 10, comprising:

removing at least some of the first layer of oxide based material to thin the same before forming the first layer of nitride based material.

17. The method of claim 11, comprising:

removing at least some of the first layer of oxide based material to thin the same before forming the first layer of nitride based material.

* * * * *